(12) United States Patent
Zluc et al.

(10) Patent No.: US 10,617,012 B2
(45) Date of Patent: Apr. 7, 2020

(54) METHODS OF MANUFACTURING FLEXIBLE PRINTED CIRCUIT BOARDS

(71) Applicant: AT&S Austria Technologie & Systemtechnik Aktiengesellschaft, Leoben (AT)

(72) Inventors: Andreas Zluc, Leoben (AT); Johannes Stahr, St. Lorenzen (AT)

(73) Assignee: AT & S AUSTRIA TECHNOLOGIE & SYSTEMTECHNIK AKTIENGESELLSCHAFT, Leoben (AT)

( * ) Notice: Subject to any disclaimer, the term of this patent is extended or adjusted under 35 U.S.C. 154(b) by 33 days.

(21) Appl. No.: 15/427,430

(22) Filed: Feb. 8, 2017

(65) Prior Publication Data
US 2017/0231098 A1     Aug. 10, 2017

(30) Foreign Application Priority Data
Feb. 9, 2016   (DE) .................. 10 2016 102 191

(51) Int. Cl.
*H05K 3/30*     (2006.01)
*H01L 21/48*   (2006.01)
(Continued)

(52) U.S. Cl.
CPC ......... *H05K 3/305* (2013.01); *H01L 21/4857* (2013.01); *H01L 23/4985* (2013.01); *H01L 23/5389* (2013.01); *H01L 24/19* (2013.01); *H01L 24/20* (2013.01); *H05K 1/0203* (2013.01); *H05K 1/028* (2013.01); *H05K 1/18* (2013.01); *H05K 3/007* (2013.01); *H05K 3/22* (2013.01);
(Continued)

(58) Field of Classification Search
CPC .......... H05K 3/305; H05K 3/007; H05K 3/22; H05K 3/4038; H05K 1/0203; H05K 1/028; H05K 1/18; H05K 2203/308
USPC ........................ 29/852, 846, 829, 825, 592.1
See application file for complete search history.

(56) References Cited

U.S. PATENT DOCUMENTS

| 6,762,510 B2 | 7/2004 | Fock et al. |
| 7,292,381 B1 | 11/2007 | Patterson et al. |

(Continued)

FOREIGN PATENT DOCUMENTS

| AT | 13 055 U1 | 5/2013 |
| AT | 514074 B1 * | 10/2014 |

(Continued)

OTHER PUBLICATIONS

Extended European Search Report; dated Jun. 14, 2017.
(Continued)

*Primary Examiner* — Peter Dungba Vo
*Assistant Examiner* — Azm A Parvez
(74) *Attorney, Agent, or Firm* — Robert A. Blaha; Smith Tempel Blaha LLC

(57) ABSTRACT

A method of manufacturing a flexible electronic device is described. The method comprises arranging an electronic component on a temporary carrier, providing a flexible laminate comprising an adhesive layer, pressing the temporary carrier and the flexible laminate together with the adhesive layer facing the temporary carrier such that the electronic component is pushed into the adhesive layer, and removing the temporary carrier. Further, a corresponding flexible electronic device is described.

16 Claims, 23 Drawing Sheets

(51) Int. Cl.
*H01L 23/538* (2006.01)
*H01L 23/498* (2006.01)
*H01L 23/00* (2006.01)
*H05K 1/02* (2006.01)
*H05K 1/18* (2006.01)
*H05K 3/00* (2006.01)
*H05K 3/22* (2006.01)
*H05K 3/40* (2006.01)
*H01L 21/56* (2006.01)

(52) U.S. Cl.
CPC .......... *H05K 3/4038* (2013.01); *H01L 21/568* (2013.01); *H01L 2224/04105* (2013.01); *H01L 2224/2518* (2013.01); *H01L 2224/32225* (2013.01); *H01L 2224/73267* (2013.01); *H01L 2224/92144* (2013.01); *H01L 2924/18162* (2013.01); *H05K 2203/308* (2013.01); *Y10T 29/49165* (2015.01)

(56) References Cited

U.S. PATENT DOCUMENTS

| | | | |
|---|---|---|---|
| 9,013,017 | B2 | 4/2015 | Jin et al. |
| 9,082,881 | B1 | 7/2015 | Hackler, Sr. et al. |
| 9,253,888 | B2 * | 2/2016 | Weidinger ............. H05K 1/185 |
| 9,451,696 | B2 | 9/2016 | Seneviratne et al. |
| 9,532,466 | B2 * | 12/2016 | Lee ...................... H05K 3/4644 |
| 2002/0117743 | A1 * | 8/2002 | Nakatani ............. H01L 21/4857 257/687 |
| 2007/0059951 | A1 | 3/2007 | Volant et al. |
| 2008/0202661 | A1 | 8/2008 | Kobayashi |
| 2009/0260866 | A1 | 10/2009 | Palm et al. |
| 2011/0018123 | A1 | 1/2011 | An et al. |
| 2011/0143501 | A1 | 6/2011 | Oda et al. |
| 2011/0291293 | A1 | 12/2011 | Tuominen et al. |
| 2012/0228015 | A1 | 9/2012 | Ho |
| 2014/0110859 | A1 | 4/2014 | Rafferty et al. |
| 2016/0300745 | A1 * | 10/2016 | Chang ................. H01L 25/0753 |
| 2017/0196094 | A1 * | 7/2017 | Mayr ................... H01L 23/5389 |

FOREIGN PATENT DOCUMENTS

| | | |
|---|---|---|
| CN | 1366444 A | 8/2002 |
| CN | 103348777 A | 10/2013 |
| DE | 10 2013 102 541 A1 | 9/2014 |
| DE | 10 2014 116 416 A1 | 6/2015 |
| WO | 98/02921 A1 | 1/1998 |
| WO | WO 02/47162 | 6/2002 |

OTHER PUBLICATIONS

SIPO of P.R. China Office Action; dated Oct. 23, 2018.
Kästner, M.; EPO Office Action in Application No. 17155072.6, dated Aug. 30, 2019; pp. 1-6; European Patent Office, Rijswijk, Netherlands.

* cited by examiner

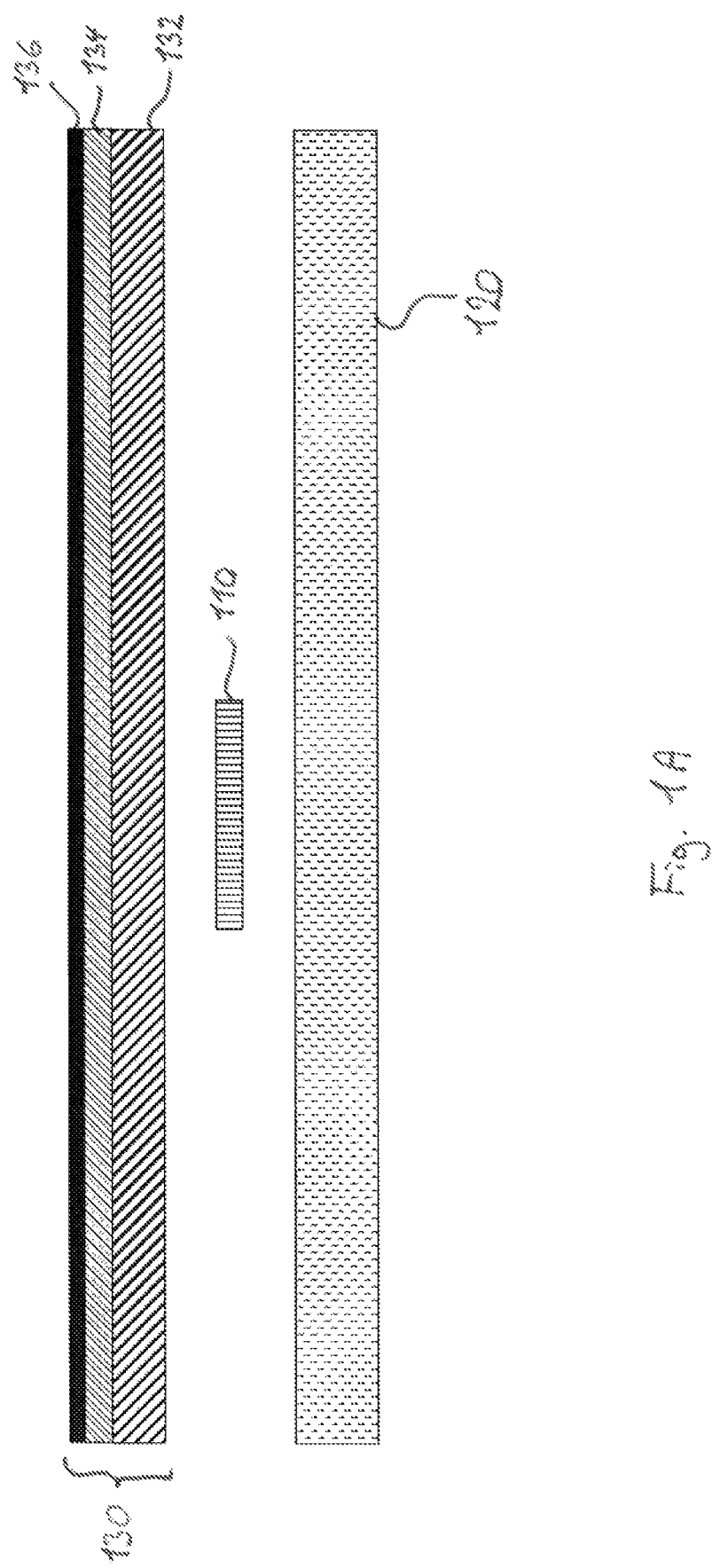

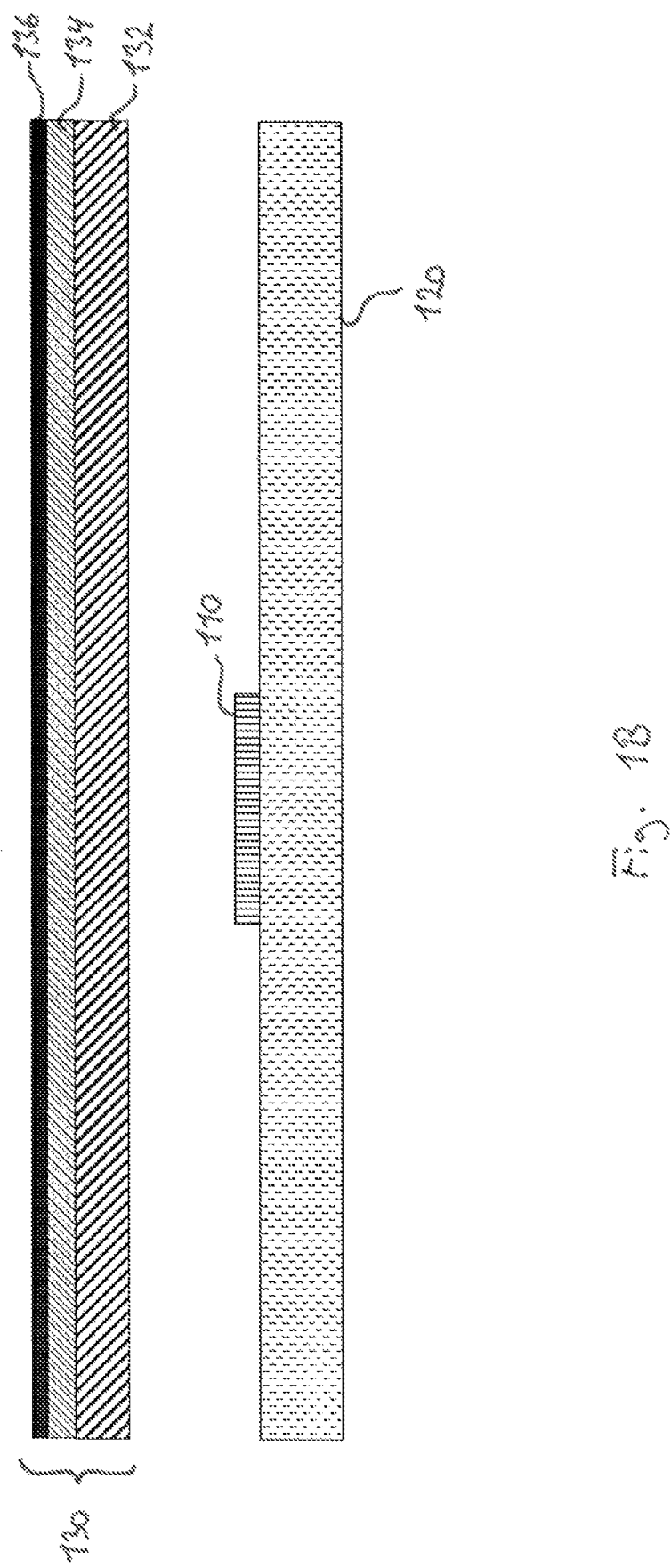

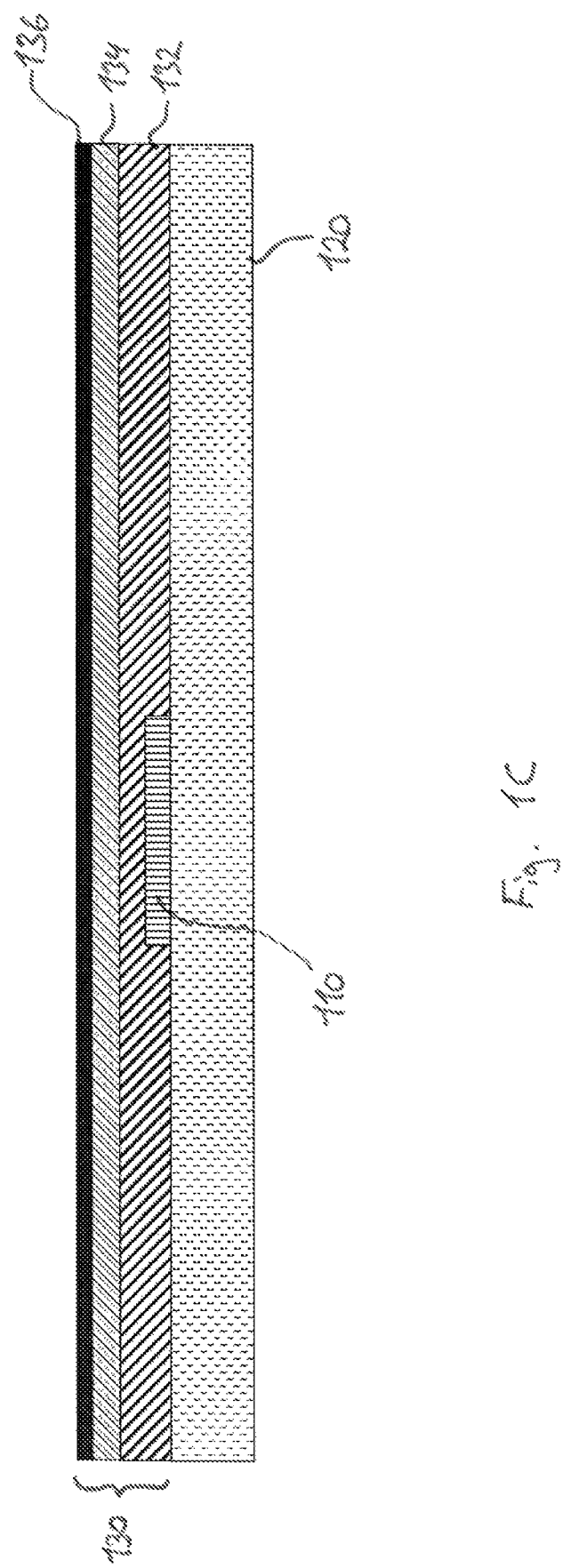

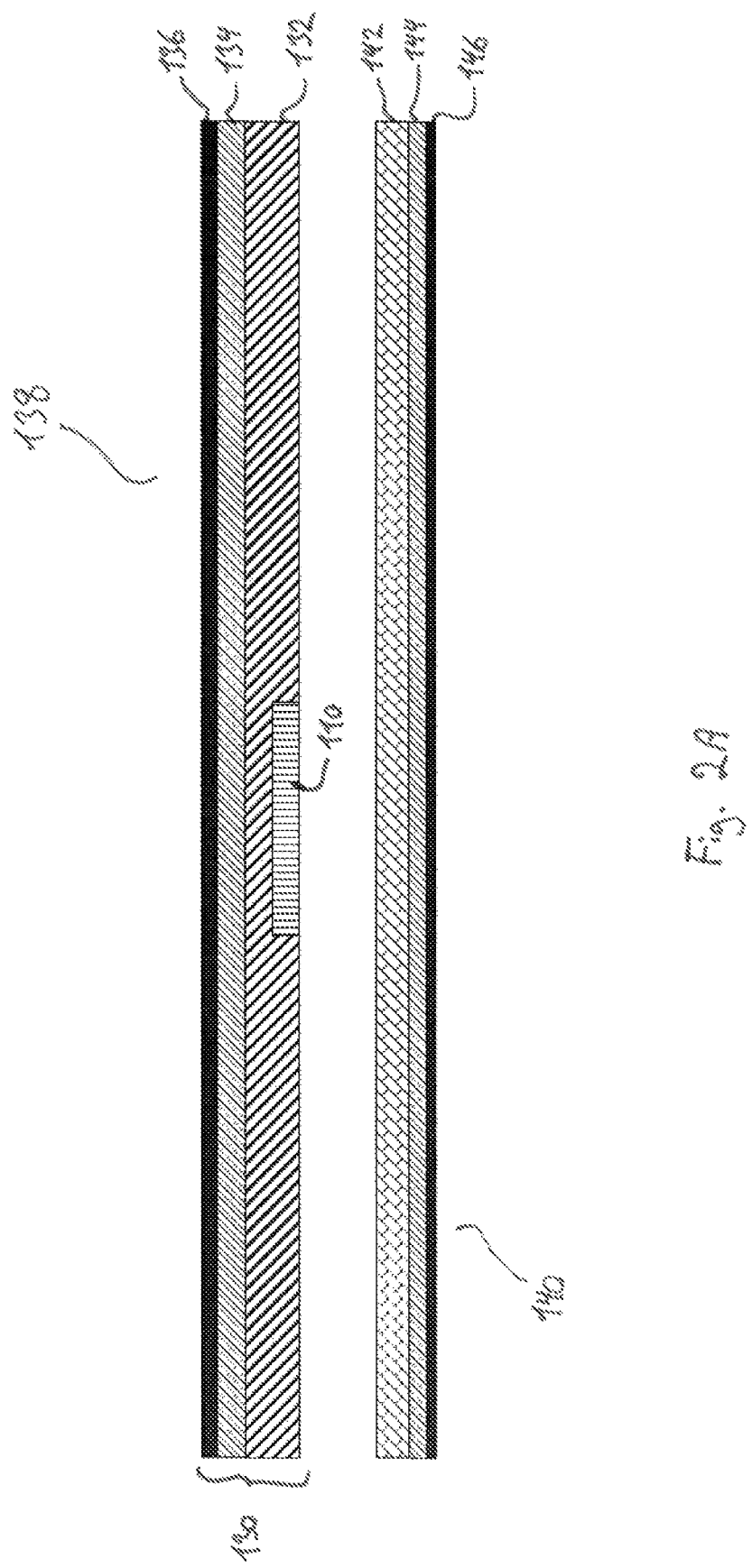

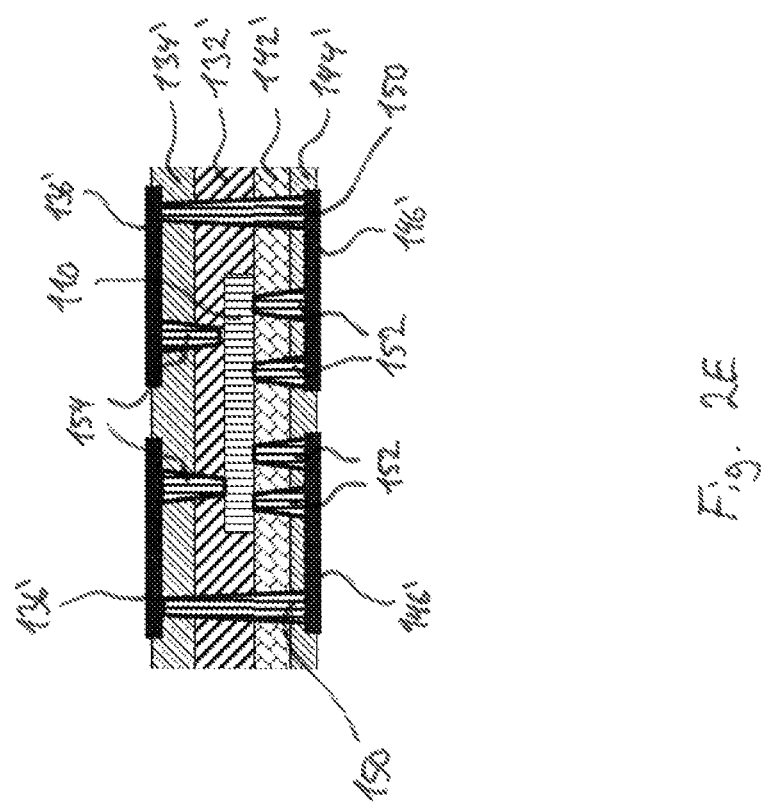

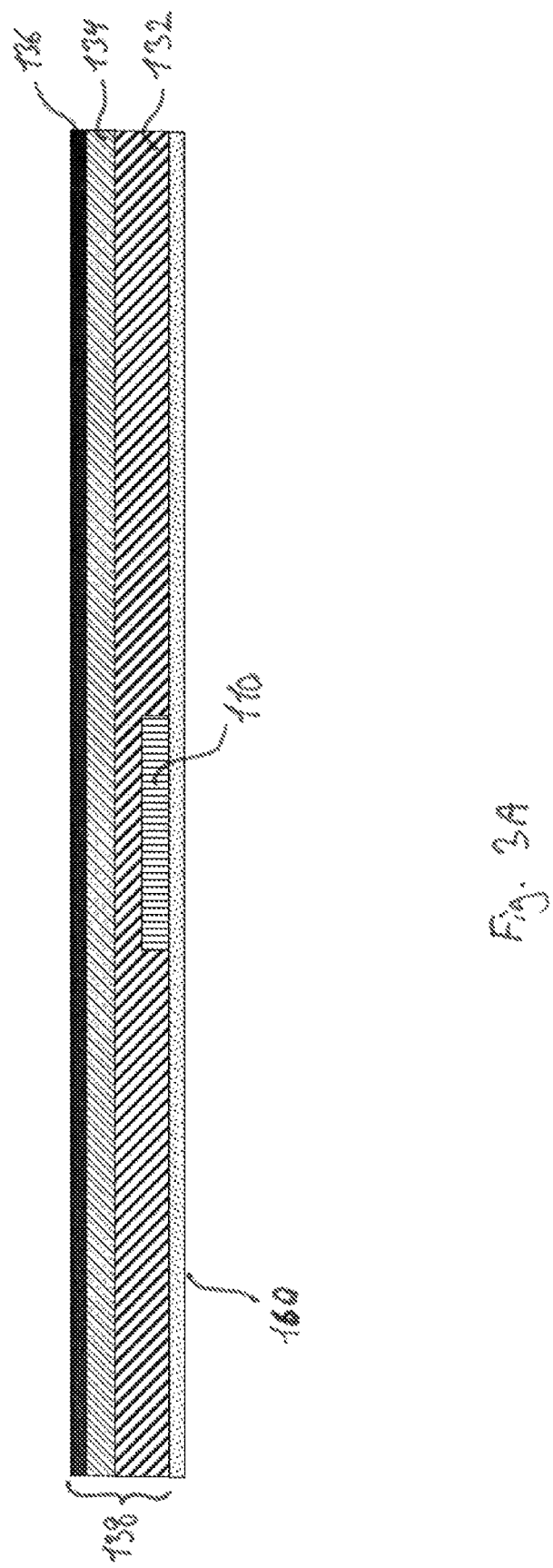

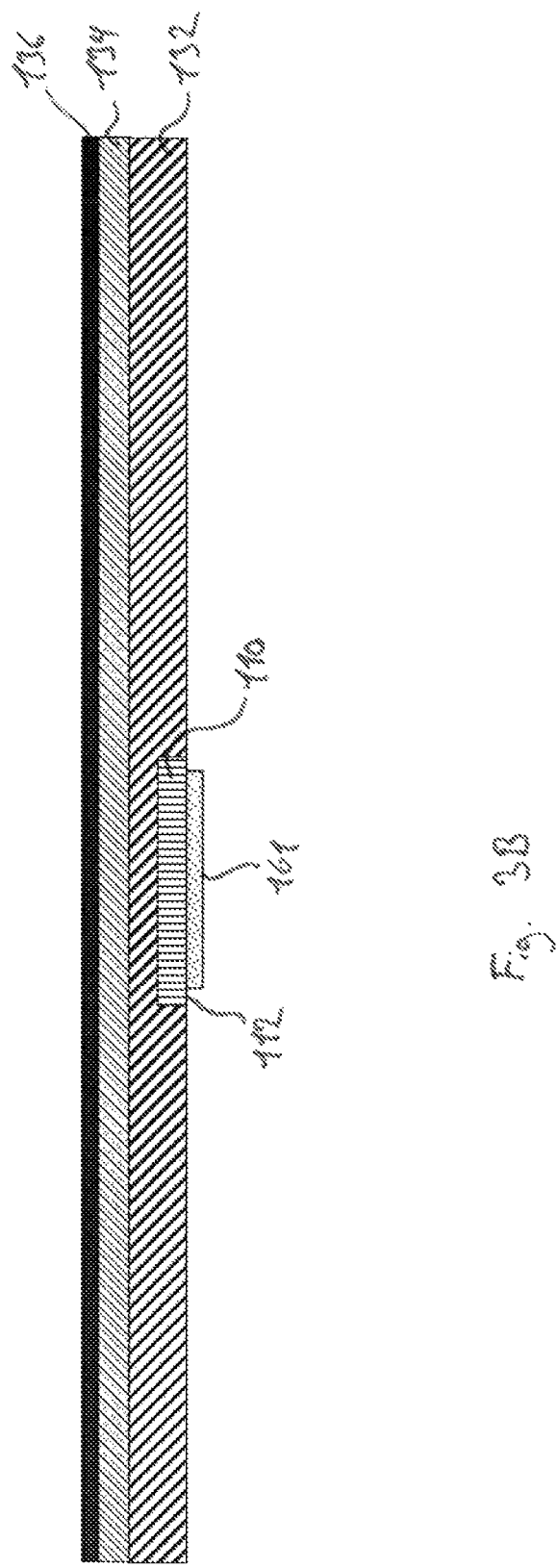

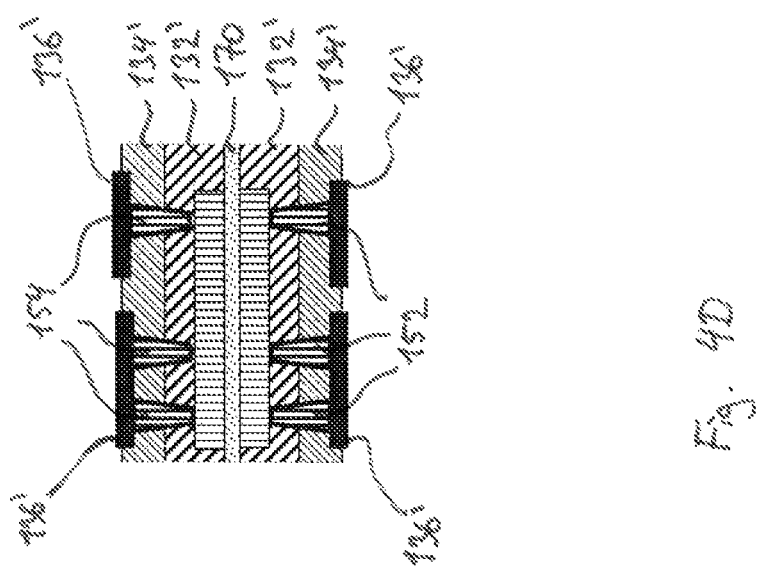

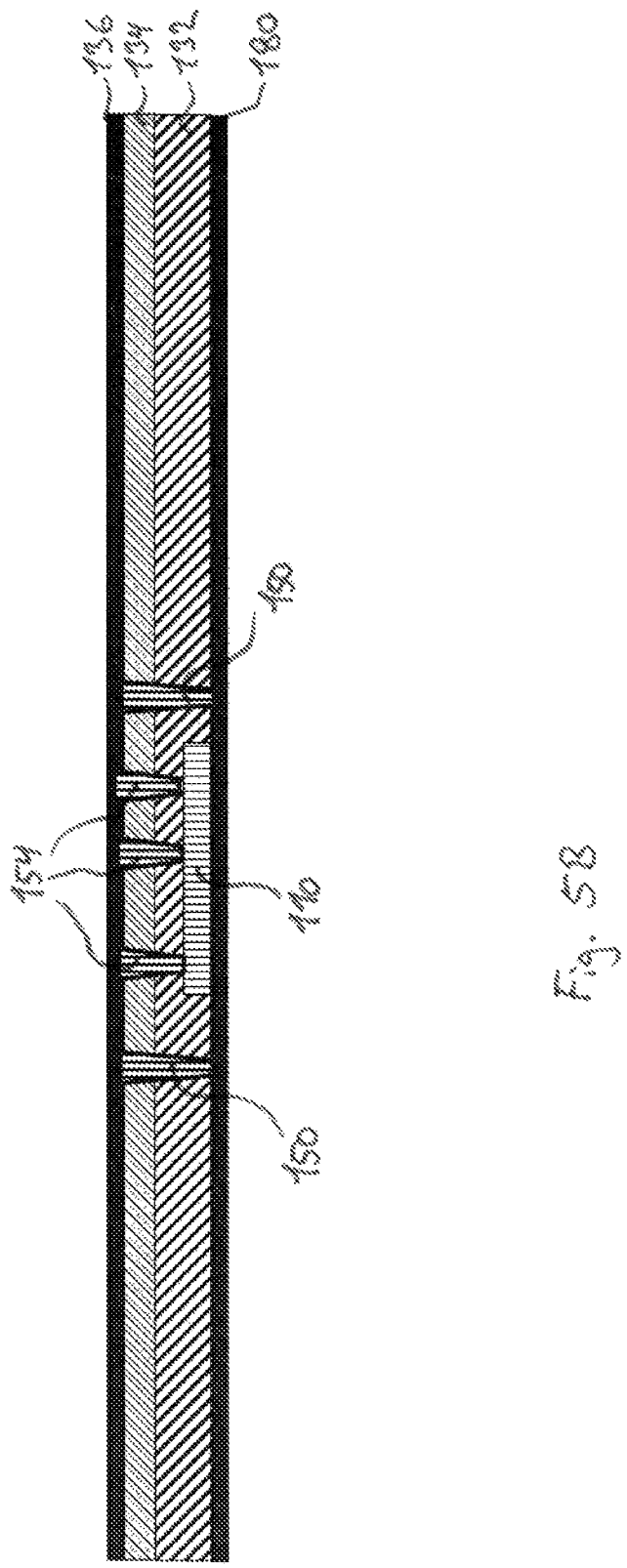

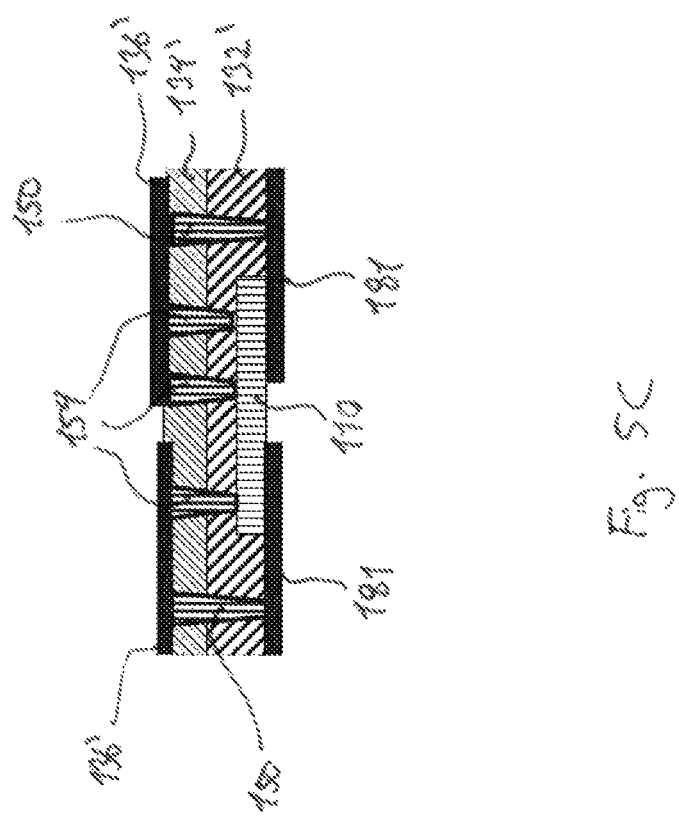

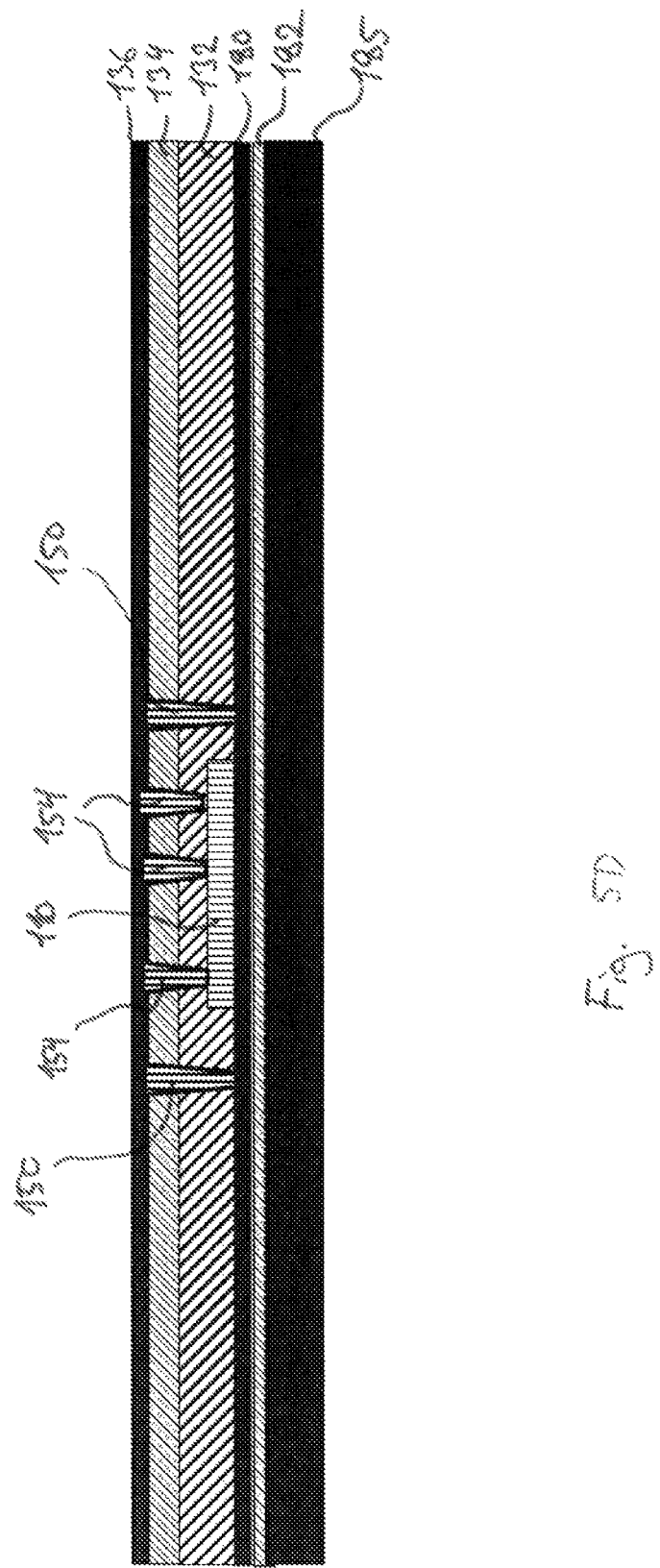

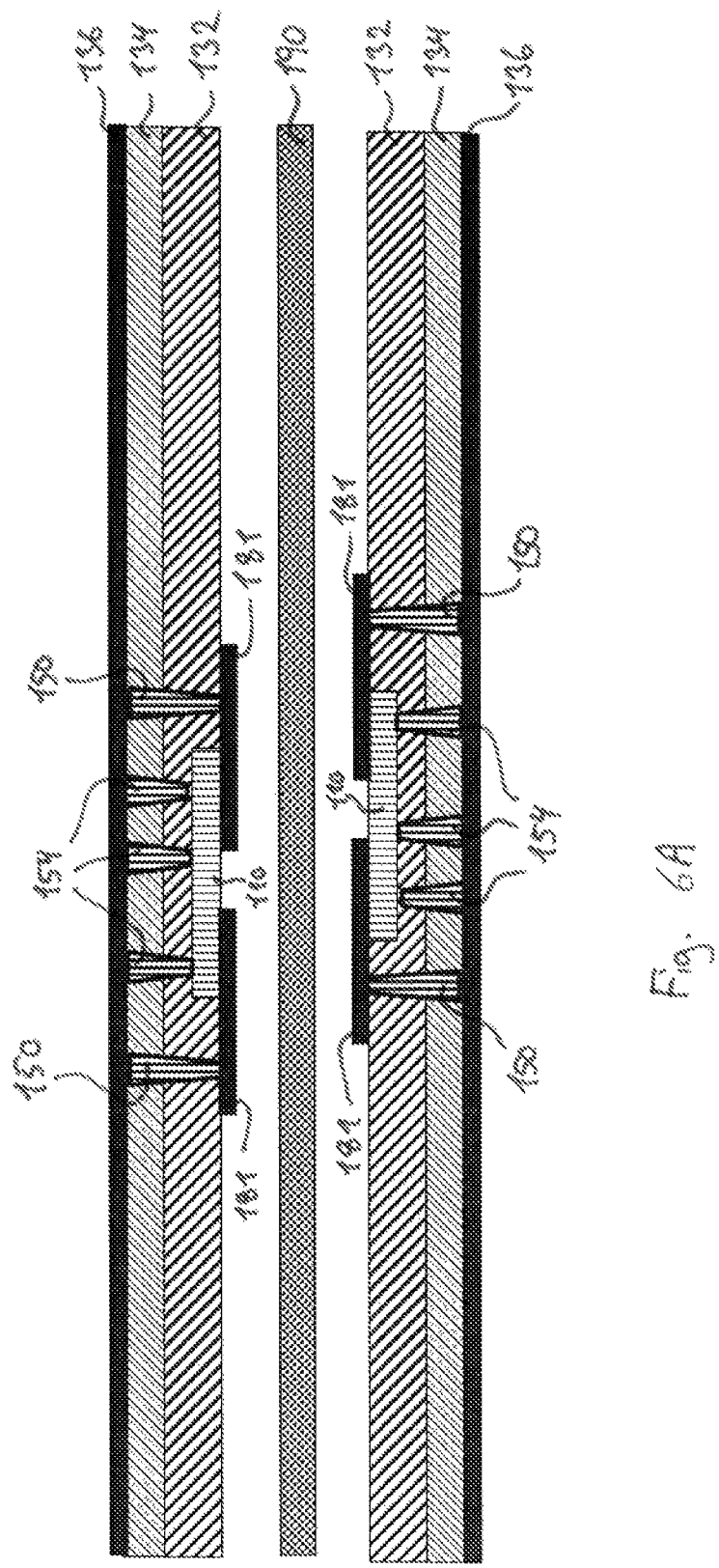

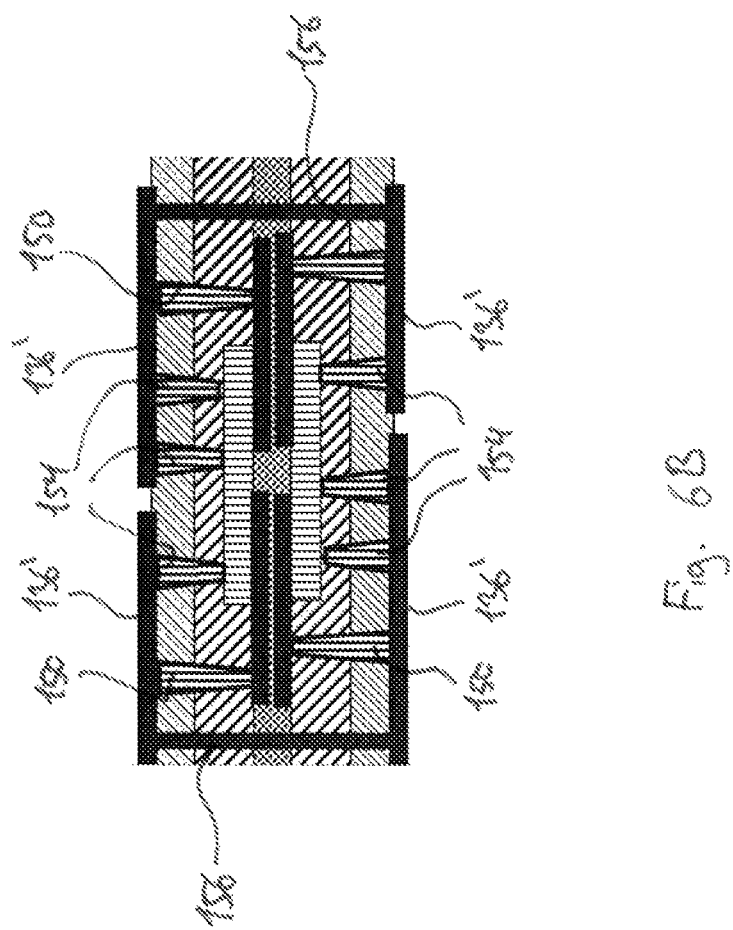

METHODS OF MANUFACTURING FLEXIBLE PRINTED CIRCUIT BOARDS

CROSS-REFERENCE TO RELATED APPLICATIONS

This application claims the benefit of the filing date of German Patent Application No. 10 2016 102 191.1 filed 9 Feb. 2016, the disclosure of which is hereby incorporated herein by reference.

TECHNICAL FIELD

Embodiments of the invention relate to flexible electronic devices, in particular to a method of manufacturing a flexible electronic device.

TECHNOLOGICAL BACKGROUND

Conventionally, naked dies and other electronic components are packaged in mold compounds made of plastic or resin. With continuous demand for small form factors and improved performance at lower costs, there is still room for improved packaging solutions.

Furthermore, a demand has appeared for packaging solutions capable of delivering flexible electronic devices containing very thin electronic components or chips, e.g., for use in devices to be carried on the human body, such as sensors, watches, etc.

Although various methods for manufacturing flexible packages have been developed (see, e.g., US 2014/110859 A1, DE 10 2014 116416 A1, and US 2007/059951 A1), a need may exist for improved methods which allow manufacture of flexible electronic devices in a simple and cost efficient manner.

SUMMARY

In order to meet the above mentioned need, a method of manufacturing an electronic device according to the independent claim is provided.

According to an exemplary embodiment of the invention, a method of manufacturing a flexible electronic device is provided. The method comprises arranging an electronic component on a temporary carrier, (b) providing a flexible laminate comprising an adhesive layer, (c) pressing the temporary carrier and the flexible laminate together with the adhesive layer facing the temporary carrier such that the electronic component is pushed into the adhesive layer, and (d) removing the temporary carrier.

According to a further exemplary embodiment of the invention, a flexible electronic device is provided. The flexible electronic device comprises (a) an electronic component; and (b) a flexible laminate comprising an adhesive layer, wherein the flexible electronic device has been manufactured by: (i) arranging the electronic component on a temporary carrier; (ii) providing the flexible laminate comprising an adhesive layer; (iii) pressing the temporary carrier and the flexible laminate together with the adhesive layer facing the temporary carrier such that the electronic component is pushed into the adhesive layer; and (iv) removing the temporary carrier.

In the context of the present application, the term "flexible laminate" may particularly denote a flexible (i.e. bendable and/or deformable) laminate structure comprising laminated layers of different materials and/or with different properties.

In the context of the present application, the term "the electronic component is pushed into the adhesive layer" may particularly denote that the electronic component is forced into the adhesive layer which is consequently deformed correspondingly in order to make room for the electronic component. Thereby, except for the side of the electronic component which is in contact with the temporary carrier, all other sides of the electronic component are brought into contact with and thus surrounded by the material of the adhesive layer.

According to an exemplary embodiment of the invention, a flexible electronic device comprising an embedded electronic component, in particular an ultra-thin component, can be manufactured in a simple manner by pressing a temporary carrier (on which the electronic component is placed) and an adhesive layer of a flexible laminate against each other such that the electronic component is pushed into the adhesive layer. After the pressing, the temporary carrier is removed. After removal of the temporary carrier, the part of the electronic component which was in contact with the temporary carrier (e.g. a surface of the component) will be exposed (i.e. accessible) and essentially parallel with the surface of the adhesive layer. The rest of the electronic component will be buried in the adhesive layer. Thus, the electronic device is ready for use in applications where the free surface of the electronic component needs to be accessed. Alternatively, further processing steps may be carried out to form additional structures covering the free surface of the electronic component (or parts thereof).

In the following, further exemplary embodiments of the method will be explained.

In an exemplary embodiment, the flexible laminate further comprises a flexible layer and an electrically conductive layer, the flexible layer being arranged between the electrically conductive layer and the adhesive layer. Thus, in this embodiment the flexible laminate is formed as a stack of (at least) three layers arranged in the following order: adhesive layer, flexible layer and electrically conductive layer.

In an exemplary embodiment, the adhesive layer comprises an adhesive material, in particular epoxy in b-stage, and/or the flexible layer comprises resin, in particular polyimide, and/or the electrically conductive layer comprises metal, in particular a metal selected from the group consisting of copper, aluminum, and nickel. By including b-stage epoxy in the adhesive layer, the electronic component may be easily pressed into the adhesive layer (with or without application of heat). A polyimide resin provides excellent flexible characteristics and also sufficient stability to the device for use in a wide variety of applications. Electrically conductive metal, such as copper, may be used to form electrically conductive structures in various ways known in the art.

In an exemplary embodiment, the flexible laminate comprises an R-FR10 foil or sheet. More specifically, the R-FR10 is a laminate material comprising a layer of polyimide with a copper layer on one side and an adhesive layer in b-stage on the other side.

In an exemplary embodiment, the adhesive layer has a thickness in the range from 5 µm to 75 µm, in particular from 10 µm to 60 µm, in particular from 15 µm to 45 µm, in particular from 20 µm to 30 µm, and/or the electronic component has a thickness in the range from 2 µm to 50 µm, in particular from 5 µm to 35 µm, in particular from 10 µm to 20 µm. As can be seen, the adhesive layer is thick enough to accommodate the electronic component but not much thicker than that. Thereby, very thin flex devices can be easily manufactured in accordance with methods of the present invention.

In an exemplary embodiment, the method further comprises a step of arranging a further flexible laminate having a further adhesive layer facing the adhesive layer of the flexible laminate and the electronic component. In other words, a further flexible laminate (which may be identical or similar to the above-mentioned flexible laminate) is arranged with its adhesive layer facing the surface formed by the adhesive layer and the electronic component which is accommodated therein. Thus, the further flexible laminate is arranged such that its layers are in reverse order compared to the order of the layers of the flexible laminate. The two flexible laminates may be pressed together (preferably with application of heat) to form a thin, essentially planar electronic device having the electronic component embedded therein and having conductive layers on both outer surfaces.

In an exemplary embodiment, the method further comprises a step of covering at least a part of the surface of the electronic component which is not covered by the adhesive layer of the flexible laminate with a protective layer. In other words, the exposed part of the electronic component is completely or partially covered with a protective layer. The protective layer may even cover the entire surface of the adhesive layer through which the electronic component is exposed. The step of covering may be performed by applying a protective layer large enough to cover the entire surface of the adhesive layer and the electronic component and then, if necessary, remove a part of the protective layer (e.g. by cutting) such that only the desired part of the adhesive layer and electronic component is covered by the protective layer.

In an exemplary embodiment, the method further comprises a step of forming a lower electrically conductive layer adjacent to and in essentially the same plane as the protective layer. In other words, a lower electrically conductive layer is formed such that the lower surface layer of the electronic device comprises essentially two sections: the lower electrically conductive layer and the protective layer.

In an exemplary embodiment, the electronic component and the flexible laminate form a subassembly and the method further comprises (a) forming a further subassembly by (a1) arranging a further electronic component on a further temporary carrier, (a2) providing a further flexible laminate comprising a further adhesive layer, (a3) pressing the further temporary carrier and the further flexible laminate together with the further adhesive layer facing the further temporary carrier such that the further electronic component is pushed into the further adhesive layer, and (a4) removing the further temporary carrier, and (b) arranging a release layer between the subassembly and the further subassembly such that the adhesive layer of the first subassembly contacts one side of the release layer and the further adhesive layer of the further subassembly contacts the other side of the release layer.

In short, a further subassembly, which is similar or identical to the sub-assembly, is formed. Then, a release layer is arranged between the two subassemblies such that the respective adhesive layer of each subassembly contacts a respective side of the release layer.

In an exemplary embodiment, the method further comprises a step of removing the release layer. In other words, after possible further adaptation or addition of additional layers (depending on the particular electronic device to be manufactured), the release layer may be removed and the subassemblies are thereby separated from each other, such that in the end two electronic devices (which may be interconnected or not) are formed.

In an exemplary embodiment, the method further comprises a step of providing a lower electrically conductive layer on at least a part of the adhesive layer and/or a part of the electronic component which is not covered by the adhesive layer.

By forming a lower electrically conductive layer on (at least a part of) the surface constituted by the adhesive layer and the exposed part of the electronic component, a two-layer (often referred to as a multi-layer) electrically conductive structure may be formed in the electronic device.

In an exemplary embodiment, the method further comprises a step of arranging a layer of thermally conductive material to dissipate heat from the electronic component. The thermally conductive material may e.g. be formed on or brought into thermal contact with the electronic component (either via the exposed surface part or other surface parts of the electronic device) such that heat generated by the electronic component during operation can be dissipated away from the electronic device.

In an exemplary embodiment, the method further comprises a step of forming at least one hole through the flexible laminate to provide electrical contact with a terminal of the electronic component. The hole may be formed by drilling, cutting, lasering, etching or any other suitable technique. In some instances, the hole may subsequently be filled with conductive material to establish the electrical connection.

In an exemplary embodiment, the method further comprises a step of removing a part of the electrically conductive layer to form an electrically conductive layer structure. In other words, the electrically conductive layer is structured such that a number of separate (and electrically isolated) conductive surface parts, such as pads and traces, are left. The structuring may be performed by any suitable technique, such as etching, lithography, etc.

In an exemplary embodiment, the electronic component is an ultrathin flexible electronic component, in particular an active or passive ultrathin flexible electronic component or chip.

In an exemplary embodiment, the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip. However, other electronic components may be embedded in the electronic device. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element. Such an electronic component may be surface-mounted on the component carrier and/or may be embedded in an interior thereof.

In an exemplary embodiment, the flexible electronic device is shaped as a plate. This contributes to the compact design of the electronic device, wherein the component carrier (i.e. the layered structure into which the electronic component is packaged or embedded) nevertheless provides a large basis for mounting electronic components thereon. Furthermore, in particular a naked die as preferred example for an embedded electronic component, can be conveniently embedded, thanks to its small thickness, into a thin plate such as a printed circuit board.

In an exemplary embodiment, the flexible electronic device is configured as one of the group consisting of a printed circuit board and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

The aspects defined above and further aspects of embodiments of the invention are apparent from the examples of embodiment to be described hereinafter and are explained with reference to these examples of embodiment.

BRIEF DESCRIPTION OF THE DRAWINGS

FIG. 1A, FIG. 1B, FIG. 1C to FIG. 1D show cross-sectional views of structures obtained during carrying out of a method of manufacturing a flexible electronic device in accordance with an exemplary embodiment of the invention.

FIG. 2A, FIG. 2B, FIG. 2C, FIG. 2D to FIG. 2E show cross-sectional views of structures obtained during carrying out of a method of manufacturing a flexible electronic device in accordance with an exemplary embodiment of the invention.

FIG. 3A, FIG. 3B to FIG. 3C show cross-sectional views of structures obtained during carrying out of a method of manufacturing a flexible electronic device in accordance with exemplary embodiment of the invention.

FIG. 4A, FIG. 4B, FIG. 4C, FIG. 4D to FIG. 4E show cross-sectional views of structures obtained during carrying out of a method of manufacturing a flexible electronic device in accordance with an exemplary embodiment of the invention.

FIG. 5A, FIG. 5B, FIG. 5C to FIG. 5D show cross-sectional views of structures obtained during carrying out of a method of manufacturing a flexible electronic device in accordance with an exemplary embodiment of the invention.

FIG. 6A and FIG. 6B show cross-sectional views of structures obtained during carrying out of a method of manufacturing a flexible electronic device in accordance with an exemplary embodiment of the invention.

DETAILED DESCRIPTION OF EXEMPLARY EMBODIMENTS

Figure 10:
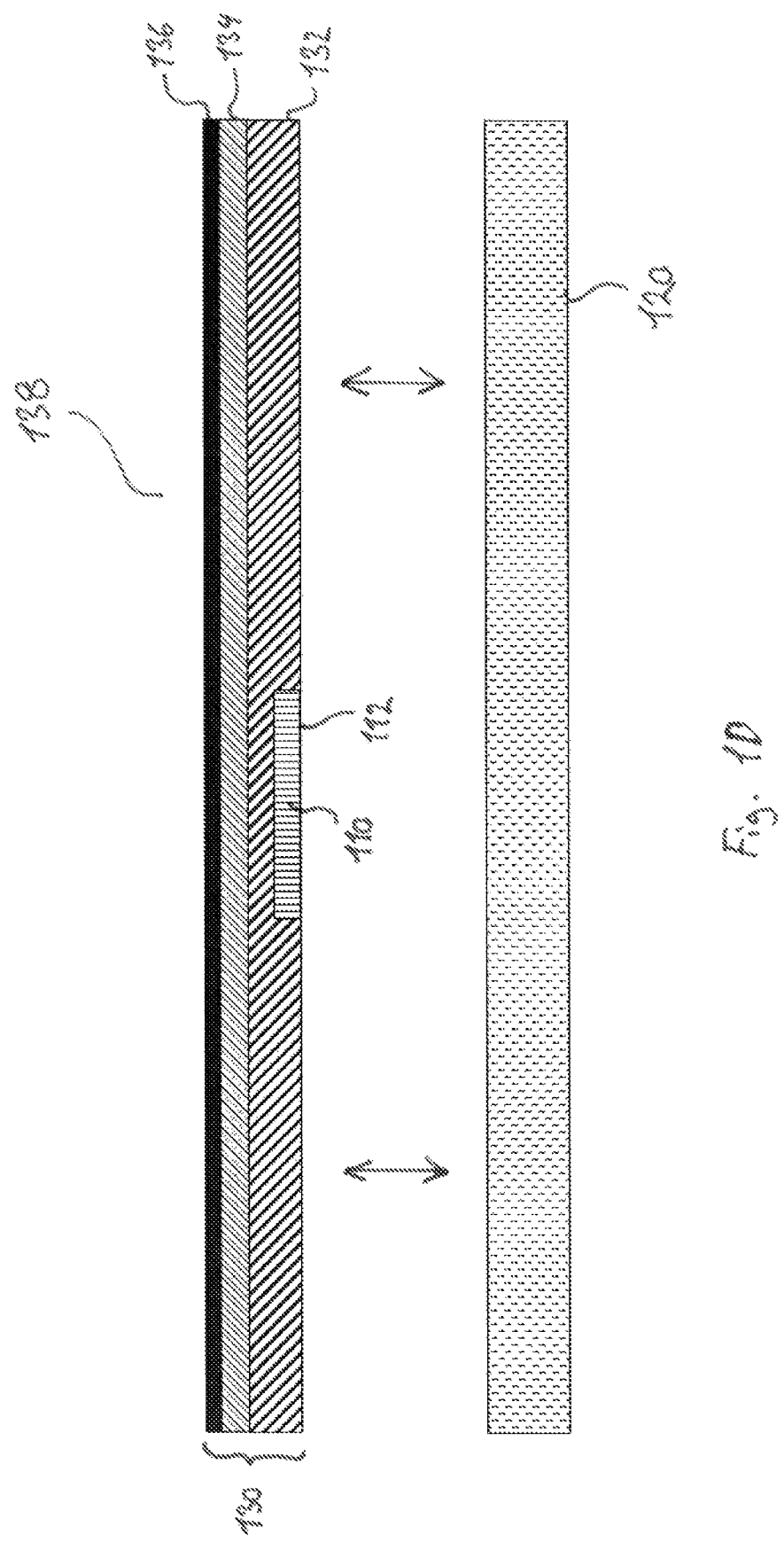

The illustrations in the drawings are schematic. In different drawings, similar or identical elements are provided with the same reference signs.

FIG. 1A to FIG. 1D show cross-sectional views of structures obtained during carrying out of a method of manufacturing a flexible electronic device in accordance with an exemplary embodiment of the invention.

More specifically, FIG. 1A shows the single items needed to begin the method of manufacturing a flexible electronic device, i.e. an electronic component 110, a temporary carrier 120, and a flexible laminate 130. The electronic component 110 is preferably a flexible naked die or a flexible chip with a thickness (i.e. the dimension in the vertical direction of the drawing) between 2 µm and 50 µm, preferably between 10 µm and 20 µm. The electronic component 110 comprises contact terminals (not shown) on one or more of its sides. The temporary carrier 120 is made of a suitable rigid carrier material, such as acrylate, polyethylene or polyimide, preferably with a silicon coating. The flexible laminate 130 is preferably a piece or sheet of R-FR10 or a similar material and comprises an adhesive layer 132, such as a layer of b-stage epoxy, a flexible layer 134, such as a layer of hardened polyimide, and an electrically conductive layer 136, such as a copper layer. The thickness of the adhesive layer is preferably between 5 µm and 75 µm, such as between 30 µm and 50 µm.

As a first step of the method, the electronic component 110 is, as shown in FIG. 1B, arranged on the temporary carrier 120. The flexible laminate 130 is provided above the temporary carrier 120 and electronic component 110 with the adhesive layer 132 facing the temporary carrier 120. Then, the temporary carrier 120 and the flexible laminate are pressed against each other in such a way that the electronic component 110 is pushed into the adhesive layer 132 of the flexible laminate 130. Here, a pressing force may be applied to either one or both of the temporary carrier 120 and flexible laminate 130. FIG. 1C shows the structure resulting from the pressing. As can be seen, the electronic component 110 is now surrounded by the adhesive layer 132 on all sides except for the side facing the temporary carrier 120. Thereafter, as shown in FIG. 1D, the temporary carrier 120 is removed, i.e., it is separated from the flexible laminate 130 and the electronic component 110. Thereby, the lower side 112 of the electronic component 110 is exposed while all remaining sides of the electronic device are surrounded by the material of the adhesive layer 132. The resulting structure 138, i.e., the flexible laminate 130 with the electronic component 110 accommodated in the adhesive layer 132, may now be processed further in a wide variety of ways, such as by adding further layers, structuring the electrically conductive layer 136, providing electrical contact with terminals of the electronic component 110, etc. The following description of exemplary embodiments provides a non-exhaustive selection of examples of such further processing.

Figure 2B:
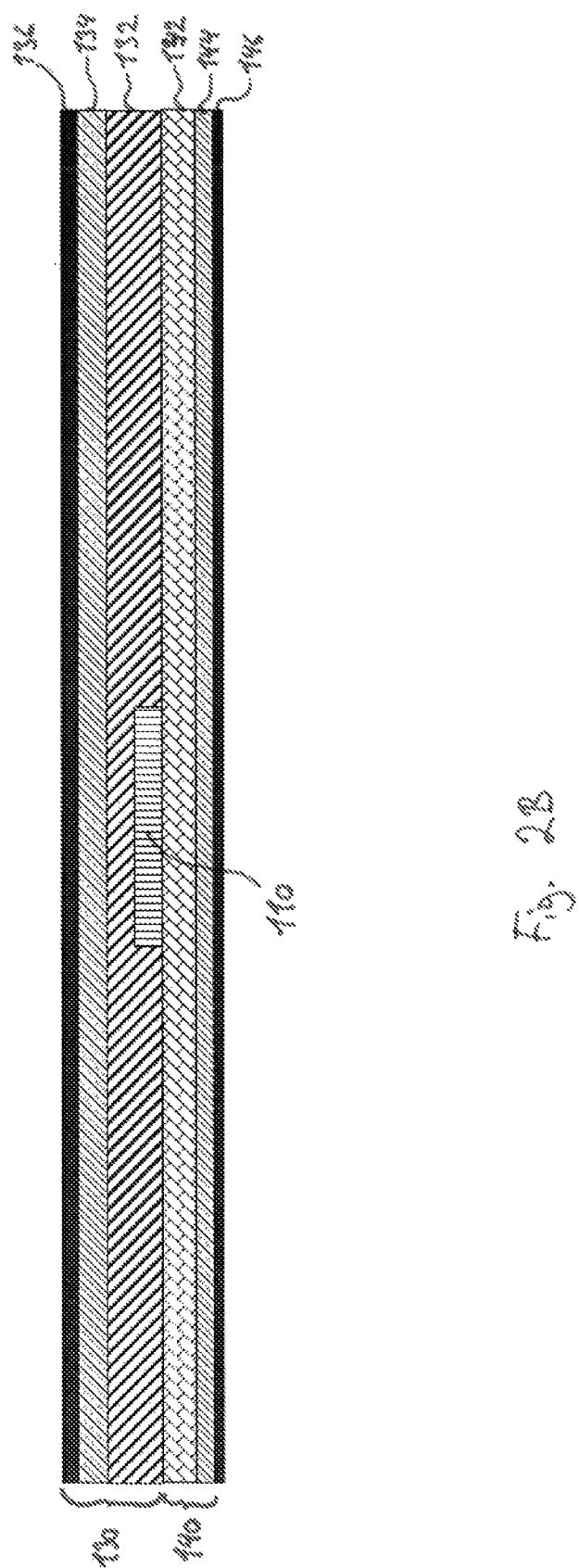

FIG. 2A to FIG. 2E show cross-sectional views of structures obtained during carrying out of a method of manufacturing a flexible electronic device in accordance with an exemplary embodiment of the invention. As shown in FIG. 2A, the starting point for the present exemplary embodiment is the structure 138 discussed above in conjunction with FIG. 1D and a further flexible laminate 140. The further flexible laminate 140 comprises an adhesive layer 142, a flexible layer 144 and an electrically conductive layer 146. In other words, the general structure of the further flexible laminate 140 is similar to the flexible laminate 130. Thus, the further flexible laminate may be identical to flexible laminate 130 or it may be made of similar materials but with different dimensions, such as layer thicknesses. The further flexible laminate 140 may in particular be thinner than the flexible laminate 130.

As shown in FIG. 2B, the further flexible laminate 140 is arranged such that the adhesive layer 142 faces the adhesive layer 132 and electronic component 110. Then, the two flexible laminates are pressed against each other and preferably heat is applied to bind the two laminates together to form an integral structure as shown in FIG. 2B.

Figure 2C:
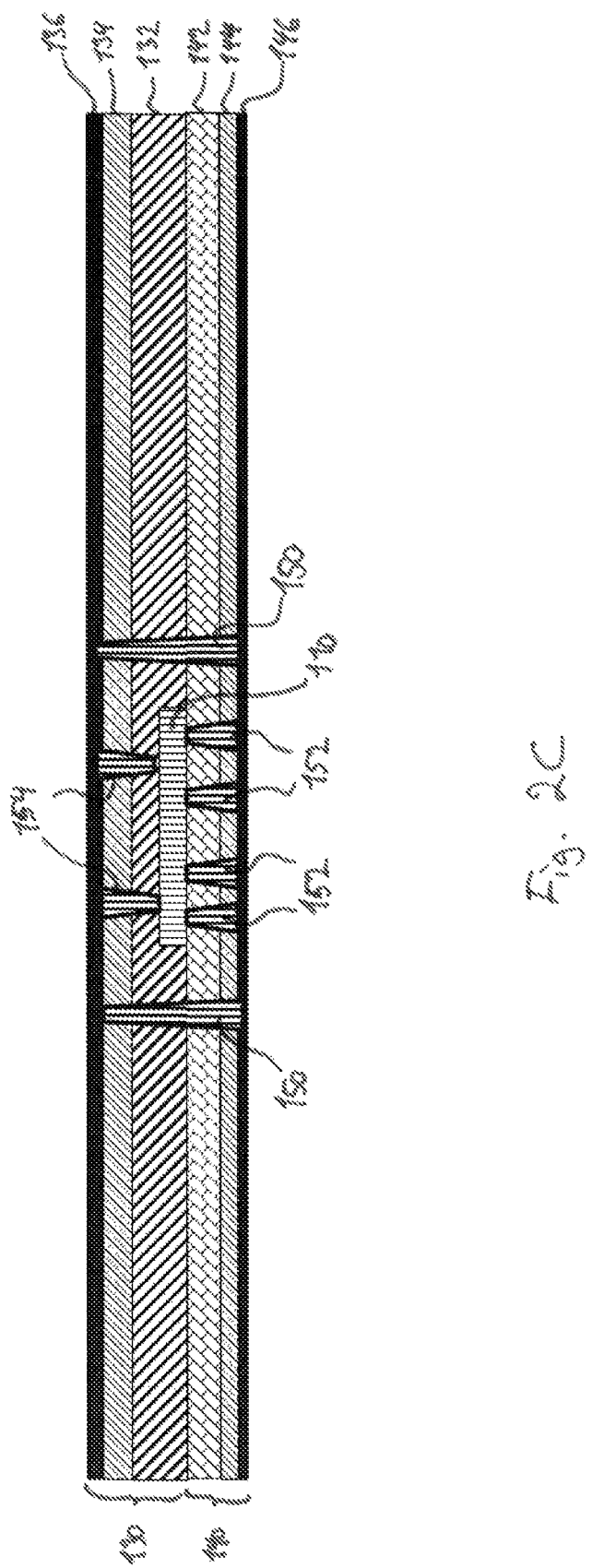

Next, as shown in FIG. 2C, vias 150, 152 and 154 are prepared by drilling or etching holes at desired positions and filling them with electrically conductive material, preferably copper. More specifically, the vias 150 extend all the way through the flexible device, i.e. between the respective electrically conductive layers 136 and 146. The vias 152 extend through the part of the device corresponding to the further flexible laminate 140, i.e. between the electrically conductive layer 146 and the electronic component 110, and serve to provide electrical and/or thermal contact between the electrically conductive layer 146 and the electronic component 110. Similarly, the vias 154 extend through the part of the device corresponding to the flexible laminate 130, i.e. between the electrically conductive layer 136 and the electronic component 110, and serve to provide electrical and/or thermal contact between the electrically conductive layer 136 and the electronic component 110.

Figure 2D:
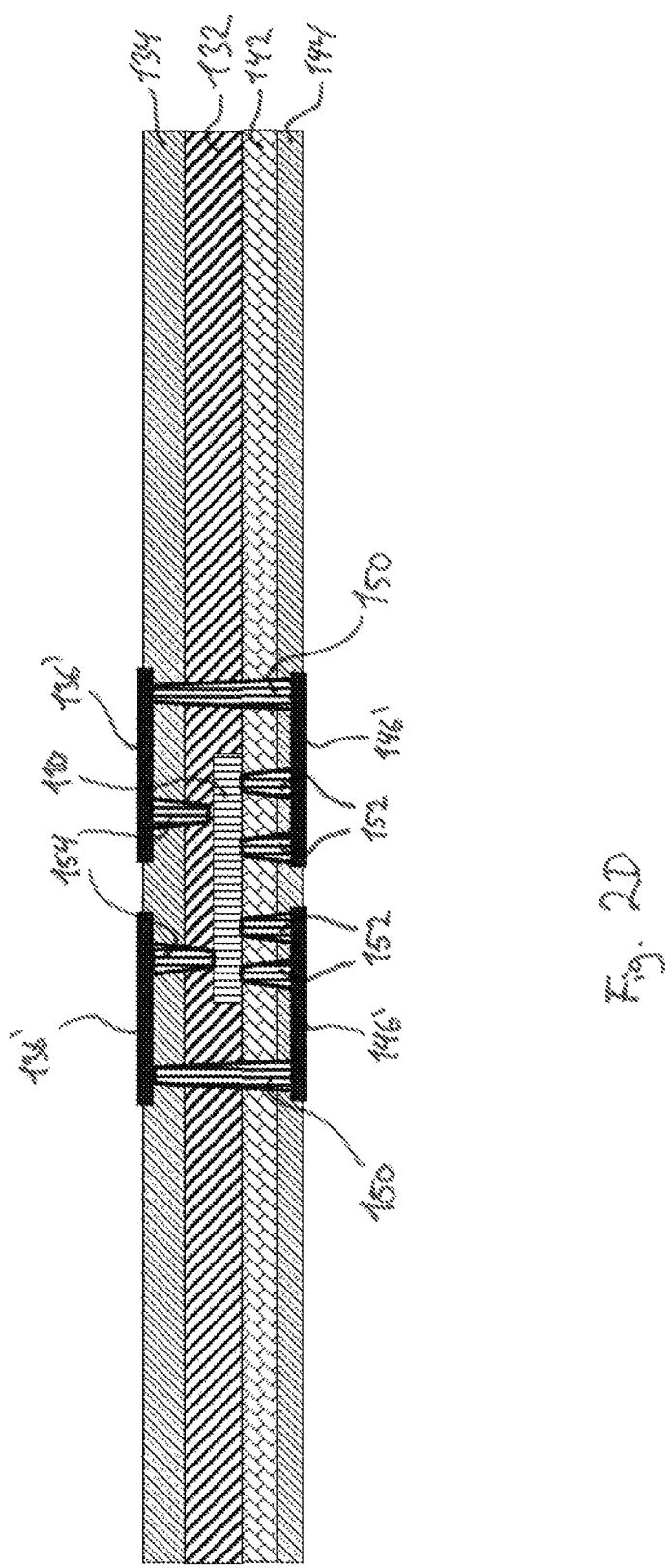

Thereafter, selected parts of the electrically conductive layers 136 and 146 are removed to form corresponding electrically conductive structures 136' and 146' as shown in FIG. 2D. Finally, the outermost parts (towards both sides in the drawing) of the structure are cut or sawn away to form the flexible electronic device shown in FIG. 2E where the remaining material of the laminate layers are labeled 132', 134', 136', 142', 144', and 146'.

Figure 3C:
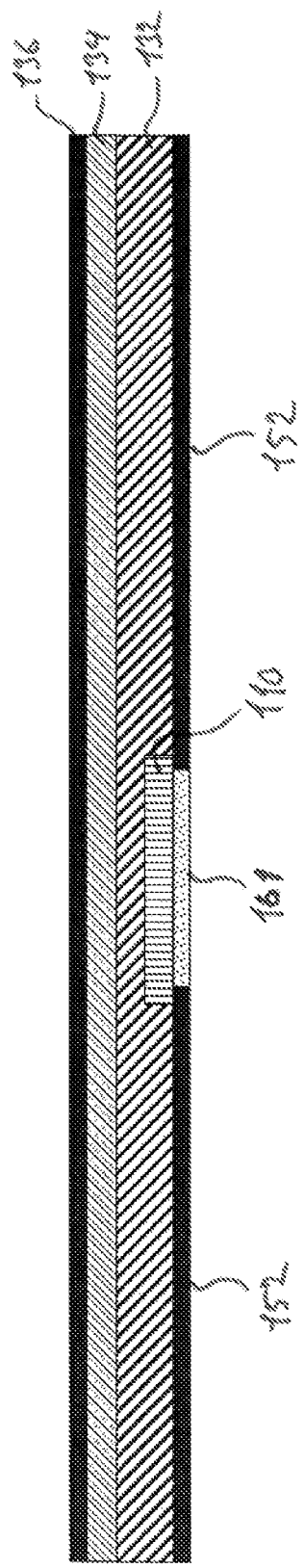
Figure 14B:
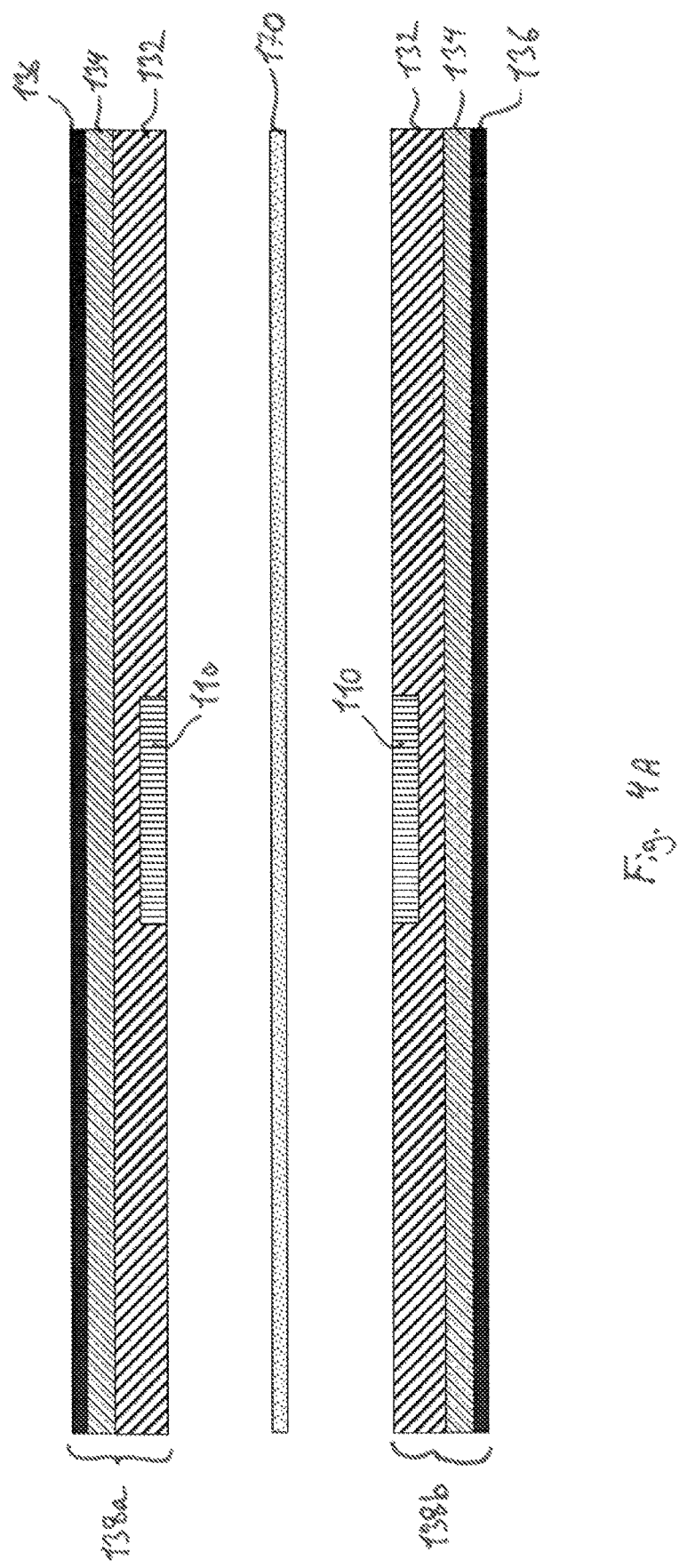

FIG. 3A to FIG. 3C show cross-sectional views of structures obtained during carrying out of a method of manufacturing a flexible electronic device in accordance with an exemplary embodiment of the invention. The starting point for the present exemplary embodiment is the structure 138 discussed above in conjunction with FIG. 1D. As shown in FIG. 3A, a layer 160 of protective material, such as plastic, is applied across the surface of the structure 138 to cover the adhesive layer 132 and the exposed part of the electronic component 110. Then, as shown in FIG. 3B, a part of the protective material is removed (e.g. cut or etched away) such that only a protective layer 161 on the exposed surface 112 of the electronic component remains. Next, as shown in FIG. 3C, a lower electrically conductive layer 152 is formed where the removed protective material was previously located. Furthermore, to finalize the flexible electronic device, similar steps of interconnecting and structuring the electrically conductive layers 136 and 152 as well as cutting or dicing as the steps discussed above in conjunction with FIG. 2C to FIG. 2E may be performed. The present embodiment is particularly suitable for applications where the electronic component 110 is a sensor and the exposed surface 112 of the sensor is supposed to be in contact with an external surface, such as the skin of a human being.

Figure 4B:
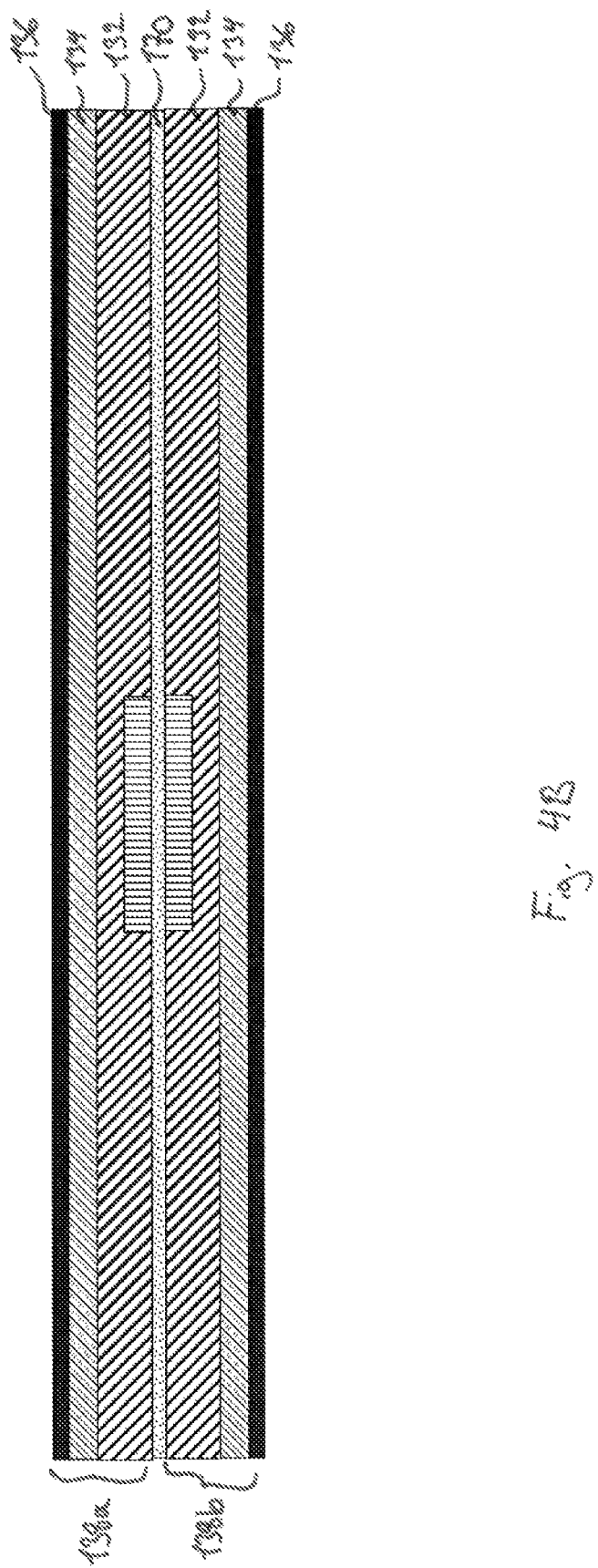
Figure 4C:
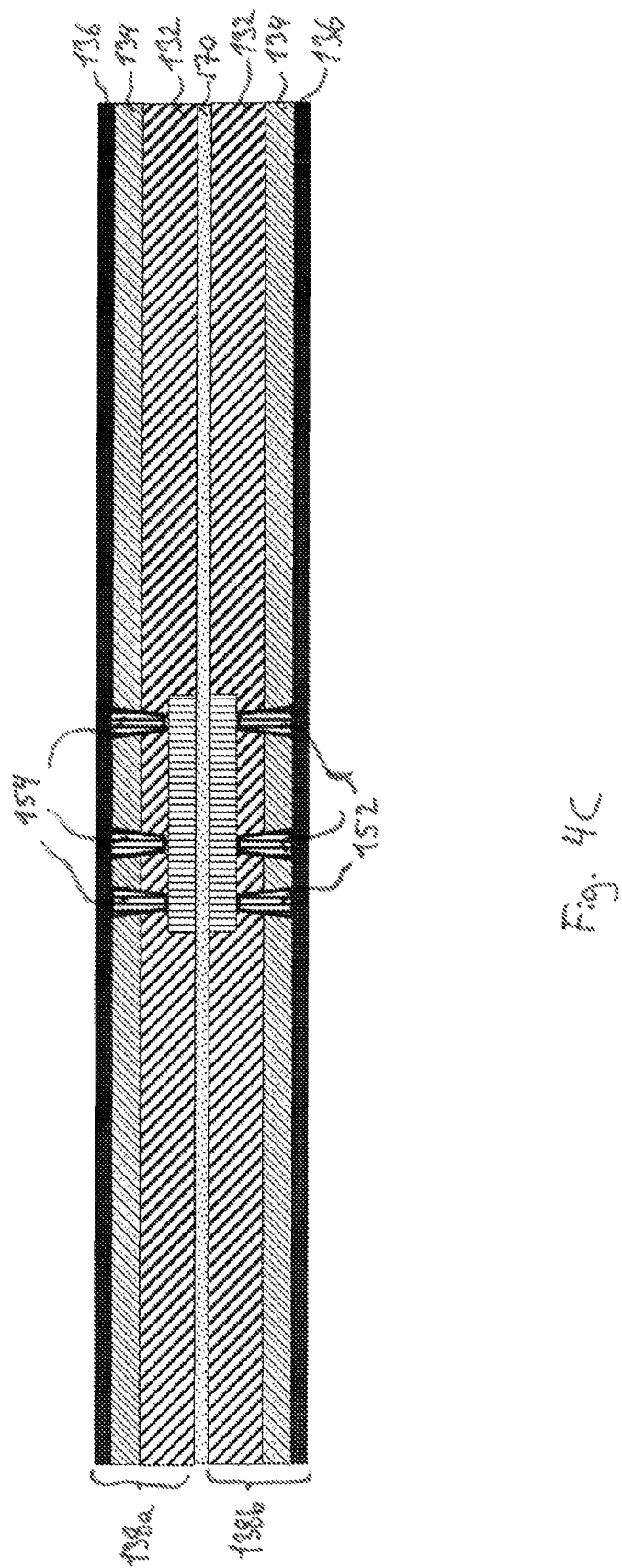
Figure 4E:
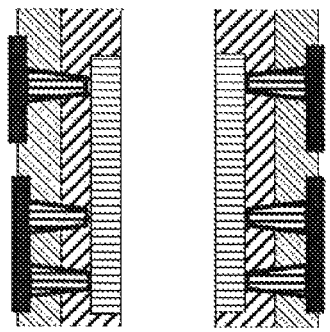

FIG. 4A to FIG. 4E show cross-sectional views of structures obtained during carrying out of a method of manufacturing a flexible electronic device in accordance with an exemplary embodiment of the invention. As shown in FIG. 4A, the starting point for the present embodiment is two samples 138a and 138b of the structure 138 discussed above in conjunction with FIG. 1D and a release layer 170. More specifically, the structures 138a and 138b are arranged with their respective adhesive layers 132 facing each other and the release layer 170 is interposed therebetween. As shown in FIG. 4B, the two structures or subassemblies 138a and 138b and the release layer 170 are pressed together, preferably also with application of heat, to form an integral unit. Then, as shown in FIG. 4C, lower interconnecting vias 152 and upper interconnecting vias 154 are formed between the respective conductive layers 136 and the electronic component 110 in a similar manner as discussed above in conjunction with FIG. 2C. Next, as summarized in FIG. 4D and similar to the above description in conjunction with FIGS. 2D and 2E, electrically conductive structures 136' are formed by removing selected parts of the layers 136 and excess material at the right and left hand sides is removed. Then, the release layer 170 is removed and two separate two structures 138a' and 138b' are obtained.

Figure 5A:
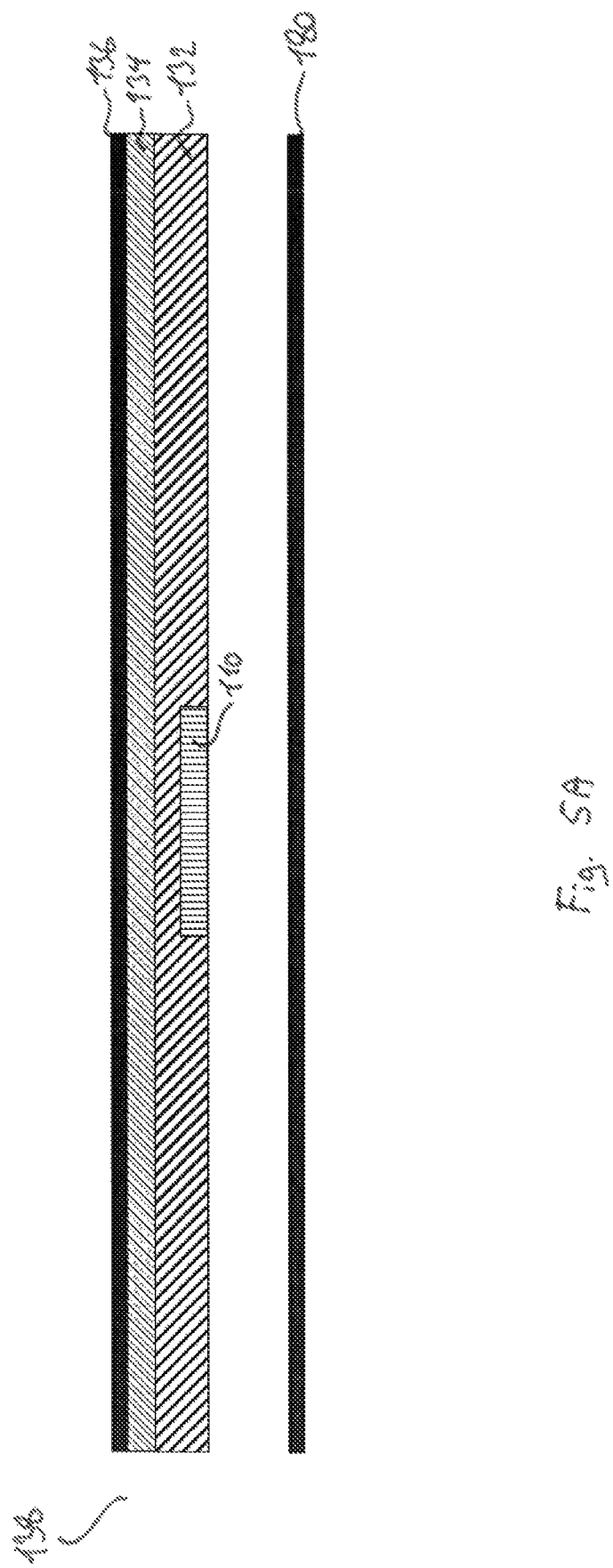

FIG. 5A to FIG. 5D show cross-sectional views of structures obtained during carrying out of a method of manufacturing a flexible electronic device in accordance with an exemplary embodiment of the invention. As shown in FIG. 5A, the starting point for the present exemplary embodiment is a structure 138 as discussed above in conjunction with FIG. 1D and an electrically conductive layer 180, such as a copper layer. Then, as shown in FIG. 5B, the electrically conductive layer 180 is formed (e.g. using chemical and galvanic processes, screen printing, inkjet, dispensing, PVT or coating) on the adhesive layer 132 of the structure 138, such that the electrically conductive layer is in direct contact with the exposed surface of the electronic component 110. Thereby, the electrically conductive layer 180 may additionally serve to conduct heat away from the electronic component 110. The electrically conductive layer may also be pressed or glued onto the adhesive layer 132 of the structure 138, in which case a thin layer of dielectric material will be interposed between the electrically conductive material and the surface of the electrical component 110, such that the heat conducting properties may be somewhat reduced. Furthermore, interconnecting vias 150 and 154 similar to those described above in conjunction with FIG. 2C are formed. Next, as shown in FIG. 5C, upper electrically conductive structures 136' and lower electrically conductive structures 181 are formed by removing parts of the electrically conductive material, and excess material at the sides are cut away. Optionally (before or after performing the steps illustrated in FIG. 5C), a layer of thermally conductive material 185, such as copper, may as shown in FIG. 5D be glued onto the electrically conductive layer 180 using an adhesive layer 182. The Thermally conductive layer 185 may be used to dissipate heat generated by the electronic component 110 during operation.

FIG. 6A and FIG. 6B show cross-sectional views of structures obtained during carrying out of a method of manufacturing a flexible electronic device in accordance with an exemplary embodiment of the invention. In this embodiment, two structures 138 as discussed above in conjunction with FIG. 1D have, as shown in FIG. 6A, been equipped with respective lower conductive structures 181 (see also FIG. 5C) and vias 150 and 154, and are then arranged with a bonding layer 190 between them in such a way that the adhesive layers 132 of both subassemblies face the bonding layer 190. Then, as shown in FIG. 6B, the two structures are bonded together using the bonding layer 190 to form an integral unit. As also shown in FIG. 6B, outer electrically conductive structures 136' and additional vias

156 extending all the way through the structure are formed and excess material towards the sides are removed.

As discussed and exemplified above, methods according to the present invention provide a simple and highly variable approach to manufacturing flexible electronic devices with thin electronic components embedded therein.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A method of manufacturing a flexible printed circuit board, the method comprising:
    forming a subassembly by
        arranging an electronic component directly on a temporary carrier;
        providing a flexible laminate comprising an electrically insulating adhesive layer;
        pressing the temporary carrier and the flexible laminate together with the electrically insulating adhesive layer facing the temporary carrier such that the electronic component is pushed into the electrically insulating adhesive layer; and
        removing the temporary carrier;
    forming a further subassembly by
        arranging a further electronic component on a further temporary carrier;
        providing a further flexible laminate comprising a further electrically insulating adhesive layer;
        pressing the further temporary carrier and the further flexible laminate together with the further electrically insulating adhesive layer facing the further temporary carrier such that the further electronic component is pushed into the further electrically insulating adhesive layer; and
        removing the further temporary carrier; and
    arranging a release layer between the subassembly and the further subassembly such that the electrically insulating adhesive layer of the subassembly contacts one side of the release layer and the further electrically insulating adhesive layer of the further subassembly contacts an opposed side of the release layer.

2. The method according to claim 1, wherein the flexible laminate further comprises a flexible layer and an electrically conductive layer, the flexible layer being arranged between the electrically conductive layer and the electrically insulating adhesive layer.

3. The method according to claim 2, wherein the method comprises at least one of the following features:
    the electrically insulating adhesive layer comprises an adhesive material;
    the flexible layer comprises resin;
    the electrically conductive layer comprises metal.

4. The method according to claim 1, wherein the flexible laminate comprises an R-FR10 foil.

5. The method according to claim 1, wherein the method comprises at least one of the following features:
    the electrically insulating adhesive layer has a thickness in a range from 5 µm to 75 µm;
    the electronic component has a thickness in a range from 2 µm to 50 µm.

6. The method according to claim 1, further comprising:
    arranging a further flexible laminate having a further electrically insulating adhesive layer facing the electrically insulating adhesive layer of the flexible laminate and the electronic component.

7. The method according to claim 1, further comprising:
    covering at least a part of a surface of the electronic component which is not covered by the electrically insulating adhesive layer of the flexible laminate with a protective layer.

8. The method according to claim 7, further comprising:
    forming a lower electrically conductive layer adjacent to and in essentially a same plane as the protective layer.

9. The method according to claim 1, further comprising: removing the release layer.

10. The method according of claim 1, further comprising:
    providing a lower electrically conductive layer on at least one of a part of the electrically insulating adhesive layer and a part of the electronic component which is not covered by the electrically insulating adhesive layer.

11. The method according to claim 1, further comprising:
    arranging a layer of thermally conductive material to dissipate heat from the electronic component.

12. The method according to claim 1, further comprising:
    forming at least one hole through the flexible laminate to provide electrical contact with a terminal of the electronic component.

13. The method according to claim 2, further comprising:
    removing a part of the electrically conductive layer to form an electrically conductive layer structure.

14. The method according to claim 1, wherein the electronic component is an ultrathin flexible electronic component.

15. The method according to claim 1, wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

16. The method according to claim 1, wherein the flexible printed circuit board is shaped as a plate.

* * * * *